United States Patent
Wolke et al.

(10) Patent No.: US 12,416,865 B2
(45) Date of Patent: Sep. 16, 2025

(54) OPTICAL SYSTEM, IN PARTICULAR FOR MICROLITHOGRAPHY, AND METHOD FOR OPERATING AN OPTICAL SYSTEM

(71) Applicant: Carl Zeiss SMT GmbH, Oberkochen (DE)

(72) Inventors: Conrad Wolke, Aalen (DE); Barbara Moser, Sontheim an der Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 48 days.

(21) Appl. No.: 18/186,396

(22) Filed: Mar. 20, 2023

(65) Prior Publication Data
US 2023/0314959 A1    Oct. 5, 2023

(30) Foreign Application Priority Data
Mar. 30, 2022   (DE) .......................... 102022107633.4

(51) Int. Cl.
*G03F 7/20* (2006.01)
*G03F 7/00* (2006.01)

(52) U.S. Cl.
CPC ...... *G03F 7/70583* (2013.01); *G03F 7/70025* (2013.01); *G03F 7/70041* (2013.01)

(58) Field of Classification Search
CPC ............. G03F 7/70583; G03F 7/70025; G03F 7/70041; G03F 7/702; G03F 7/70175; G03F 7/7055; G02B 26/06; G02B 27/48; H01S 3/0057; H01S 3/225
See application file for complete search history.

(56) References Cited

U.S. PATENT DOCUMENTS

| | | |
|---|---|---|
| 5,343,489 A | 8/1994 | Wangler |
| 6,393,040 B1 | 5/2002 | Govorkov et al. |
| 6,898,216 B1 | 5/2005 | Kleinschmidt |
| 7,778,302 B2 | 8/2010 | Ershov et al. |
| 7,782,922 B2 | 8/2010 | Hori et al. |
| 10,451,890 B2 | 10/2019 | Op't Root et al. |
| 11,025,026 B2 | 6/2021 | Onose |
| 11,054,665 B2 | 7/2021 | Op't Root et al. |
| 2012/0153189 A1 | 6/2012 | Wangler et al. |
| 2012/0154895 A1 | 6/2012 | Muenz et al. |
| 2018/0203248 A1 | 7/2018 | Op't Root et al. |

(Continued)

FOREIGN PATENT DOCUMENTS

| | | |
|---|---|---|
| DE | 196 16 863 A1 | 10/1996 |
| DE | 102 45 231 A1 | 4/2004 |

(Continued)

OTHER PUBLICATIONS

TW—Office Action and Search Report, with translation thereof, for corresponding TW—Patent Application 112108641 dated Jan. 25, 2024.

(Continued)

*Primary Examiner* — Mesfin T Asfaw
(74) *Attorney, Agent, or Firm* — Fish & Richardson P.C.

(57) ABSTRACT

An optical system, in particular for microlithography, comprises a laser light source for generating a multiplicity of light pulses, and a control unit configured to control the laser light source in such a way that, for a light pulse sequence generated by the laser light source, the time period between respectively successive light pulses varies across the light pulse sequence. A method comprises operating the optical system.

19 Claims, 5 Drawing Sheets

(56) References Cited

U.S. PATENT DOCUMENTS

| | | | |
|---|---|---|---|
| 2021/0022602 A1 | 1/2021 | Freimann | |
| 2021/0231965 A1 | 7/2021 | Kraus | |
| 2021/0242649 A1 | 8/2021 | Onose | |
| 2021/0344157 A1 | 11/2021 | Godfried et al. | |

FOREIGN PATENT DOCUMENTS

| | | |
|---|---|---|
| DE | 10 2008 035 898 A1 | 2/2009 |
| DE | 10 2009 037 113 A1 | 9/2010 |
| DE | 10 2009 037 112 B4 | 10/2012 |
| DE | 10 2009 037 141 B4 | 1/2013 |
| DE | 10 2014 004 073 A1 | 9/2015 |
| DE | 10 2017 217 251 A1 | 3/2019 |
| DE | 10 2018 218 064 A1 | 4/2020 |
| EP | 0 525 528 B1 | 11/1996 |
| EP | 1 124 293 B1 | 11/2009 |
| EP | 1 867 015 B1 | 11/2012 |
| EP | 3 354 394 A1 | 8/2018 |
| EP | 3 327 880 B1 | 9/2019 |
| JP | H 09-107146 A | 4/1997 |
| JP | 2008-277617 A | 11/2008 |
| JP | 2008-277618 A | 11/2008 |
| JP | 2013-061677 A | 4/2013 |
| JP | 2014-239088 A | 12/2014 |
| JP | 2021-114622 A | 8/2021 |
| JP | 2021-534460 A | 12/2021 |
| TW | 200737625 A | 10/2007 |
| WO | WO 2008/141776 A1 | 11/2008 |
| WO | WO 2018/132198 A1 | 7/2019 |
| WO | WO 2020/083543 A1 | 4/2020 |
| WO | WO 2021/076658 A1 | 4/2021 |
| WO | WO 2021/091730 A1 | 5/2021 |

OTHER PUBLICATIONS

TW—Office Action and Search Report, with translation thereof, for TW—Patent Appl No. 113112328, dated Jun. 24, 2024.
H. Miyamoto et al.: "Next generation ArF Laser technologies for multiple-patterning immersion lithography supporting leading edge processes", Optical Microlithography XXXI, Proc. of SPIE vol. 10587 (2018), 1058710-1 to 1058710-8.
K. Kakizaki et al.: "Ultra-high-repetition-rate ArF excimer laser with long pulse duration for 193-nm lithography", Optical Microlithography XIV, Proc. of SPIE vol. 4346 (2001), pp. 1210-1218.
GPTO—Office Action, with translation thereof, for corresponding DE 10 2022 107 633.4, dated Nov. 28, 2022.
Ted Cacouris et al., "Next-generation DUV light source technologiesfon 10nm and below", Proc. of SPIE, vol. 10147, Optical Microlithography XXX, 1014718 (2017), doi 12.2260319.
Paolo Alagna et al., "Lower BW and its impact on the patterning performance", Proc. SPIE 9780, Optical Microlithography XXIX, 978008 (Mar. 16, 2016); doi: 10.1117/12.2219945.
Dinesh Kanawade et al., "Neon Reduction Program on Cymer ArF Light Sources", Proc. SPIE 9780, Optical Microlithography XXIX, 97801H (Mar. 15, 2016); https://doi.org/10.1117/12.2219942.
Will Conley et al., "Impact of Bandwidth Variation on OPC Model Accuracy", Proc. SPIE 9780, Optical Microlithography XXIX, 97800K (Mar. 23, 2016); doi: 10.1117/12.2219892 https://www.spiedigitallibrary.org/conference-proceedings-of-spie/9780/1/Impact-of-bandwidth-variation-on-OPC-model-accuracy/10.1117/12.2219892.short.
Ted Cacouris et al., "DUV light source technologies for 10nm and below" San Diego, CA.
E. Rausa et al., "Means to improve light source productivity: from proof of concept to field implementation", Proc. SPIE 9780, Optical Microlithography XXIX, 97801G (Mar. 15, 2016); https://doi.org/10.1117/12.2219940.
Will Conley et al., "The Impact of Lower Light Source Bandwidth on sub-10 nm Process Node Features", Proc. SPIE 10147, Optical Microlithography XXX, 1014707 (Mar. 30, 2017); https://doi.org/10.1117/12.2260210.
Paolo Alagna et al., "Assessment of light source bandwidth impacts on image contrast enhancement using Process Window Discovery", Proc. SPIE 10147, Optical Microlithography XXX, 101471X (May 1, 2017); https://doi.org/10.1117/12.2260314.
Paolo Alagna et al., "Image contrast enhancement of multiple patterning features through lower light source bandwidth", Proc. SPIE 10147, Optical Microlithography XXX, 101470N (Mar. 30, 2017); https://doi.org/10.1117/12.2263228.
Yzzer Roman et al., "Advances in DUV Light Source Sustainability", Proc. SPIE 10147, Optical Microlithography XXX, 101471Y (Jun. 20, 2017); doi: 10.1117/12.2260307 https://www.spiedigitallibrary.org/conference-proceedings-of-spie/10147/1/Advances-in-DUV-light-source-sustainability/10.1117/12.2260307.short.
Ulrich Oechsner et al., "Laser Sources for Metrology and Machine Vision Laser diode based light sources are widely used for high precision measurement and inspection systems", Wiley 2016, Wiley-VCH Verlag GmbH & Co. KGaA, Weinheim Optik&Photonik Feb. 2016, p. 31-34.
Koji Kakizaki et al., "High-repetition-rate (6 kHz) and long-pulse-duration (50 ns) ArF excimer laser for sub-65 nm lithography", Review of Scientific Instruments, 77(3): p. 035109-1-035109-6; published Mar. 22, 2006.
Takeshi Ohta et al., "120W ArF laser with high-wavelength stability and efficiency for the next-generation multiple-patterning immersion lithography," Proc. SPIE 9426, Optical Microlithography XXVIII, 94261J (Mar. 18, 2015); doi: 10.1117/12.2085631.
Paolo Alagna et al., "Optimum ArFi laser bandwidth for 10nm node logic imaging performance," Proc. SPIE 9426, Optical Microlithography XXVIII, 942609 (Mar. 18, 2015); doi: 10.1117/12.2085823.
Keisuke Ishida et al., "The ArF laser for the next-generation multiple-patterning immersion lithography supporting green operations," Proc. SPIE 9780, Optical Microlithography XXIX, 978010 (Mar. 15, 2016); doi: 10.1117/12.2219379.
JP—Office Action, with translation thereof, for corresponding JP Appl No. 2023-051258, dated Apr. 16, 2024.
Javier Moros, et al., "Remotely Exploring Deeper-Into-Matter by Non-Contact Detection of Audible Transients Excited by Laser Radiation," Sensors 2017, 17, 2960; doi: 10.3390/s17122960 www.mdpi.com/journal/sensors.
JP—Office Action, with translation thereof, for corresponding JP Appl No. 2023-051258, dated Nov. 5, 2024.
Decision to Grant in corresponding JP Appl No. 2023-051258, dated Jun. 19, 2025, 5 pages (with English translation).
Decision to Grant in corresponding JP Appl. No. 2023-051258, dated Jun. 19, 2025, 4 pages (with machines translation into English).

OPTICAL SYSTEM, IN PARTICULAR FOR MICROLITHOGRAPHY, AND METHOD FOR OPERATING AN OPTICAL SYSTEM

CROSS-REFERENCE TO RELATED APPLICATIONS

This application claims benefit under 35 U.S.C. § 119 to German Application No. 10 2022 107 633.4, filed Mar. 30, 2022. The contents of this application is hereby incorporated by reference in its entirety.

FIELD

The disclosure relates to an optical system, in particular for microlithography, and to a method for operating an optical system. The disclosure is applicable in particular in a laser light source for use in a microlithographic projection exposure apparatus.

BACKGROUND

Microlithography is used to produce microstructured electronic components. The microlithography process is carried out in what is known as a projection exposure apparatus, which has an illumination device and a projection lens. The image of a mask (=reticle) illuminated via the illumination device is projected in this case via the projection lens onto a substrate (for example a silicon wafer) that is coated with a light-sensitive layer (photoresist) and arranged in the image plane of the projection lens in order to transfer the mask structure to the light-sensitive coating of the substrate.

In a projection exposure apparatus designed for operation in the DUV range (e.g. at operating wavelengths of less than 250 nm, in particular less than 200 nm), use is typically made of laser light sources in the form of excimer lasers, such krypton fluoride excimer lasers at an operating wavelength of 248 nm or argon fluoride excimer lasers at an operating wavelength of 193 nm.

Existing challenges in the course of the development of projection exposure apparatuses concern, firstly, increasing desired accuracy properties for microlithographically producing ever smaller structures and positioning them on the wafer and, secondly, also an increase in the throughput achieved with the respective projection exposure apparatus, this increase being desirable from the standpoint of cost considerations.

An effect that can occur with regard to the desired accuracy properties to be satisfied inter alia during operation of the laser light sources mentioned above is the occurrence of what are known as speckle patterns, which are attributable to the spatial and temporal coherence of the generated light. Such speckle patterns result inter alia in a reduced overlay accuracy of structures produced in different lithography steps and thus ultimately in an impairment of the optical performance of the projection exposure apparatus.

As far as the abovementioned increase in the throughput achieved with the respective projection exposure apparatus is concerned, an issue is that limits are imposed on an increase in the pulse energy and/or an increase in the repetition rate, each of these increases being desirable for increasing the output power of the laser light source. In this regard, an increase in the pulse energy can lead to a higher radiation loading of optical components within the laser light source and also a greater stress for electronic assemblies. One approach known in this respect involves pulses (having a pulse length of e.g. 20 ns) generated by the laser light source being stretched to a longer time duration of e.g. (100-450) ns by the use of optical pulse stretchers and degradation of downstream optical components thus being reduced accordingly. However, limits are imposed on such stretching of the pulse length owing to the structural space restrictions that exist for the optical pulse stretcher as well, and the decreasing output power as the number of reflections increases. Moreover, there is still the risk of degradation of those optical components which are situated upstream of the optical pulse stretcher in relation to the optical beam path.

On the other hand, the increase in the repetition rate and thus in the frequency of electrical discharges within the resonator of the laser light source, the increase likewise being conceivable for increasing the output power of the laser light source, can lead to acoustic resonances and ultimately to the spectral bandwidth rising above an acceptable measure.

Reference is made, purely by way of example, to WO 2018/132198 A1, U.S. Pat. Nos. 10,451,890 B2, 11,054,665 B2, 7,782,922 B2, and the publications by H. Miyamoto et al.: "Next generation ArF Laser technologies for multiple-patterning immersion lithography supporting leading edge processes", Optical Microlithography XXXI, Proc. of SPIE Vol. 10587 (2018), 1058710-1 to 1058710-8, and K. Kakizaki et al.: "Ultra-high-repetition-rate ArF excimer laser with long pulse duration for 193-nm lithography", Optical Microlithography XIV, Proc. of SPIE Vol. 4346 (2001), pages 1210-1218.

SUMMARY

The present disclosure seeks to provide an optical system, in particular for microlithography, comprising a laser light source and a method for operating an optical system which make it possible to reduce the occurrence of speckle patterns and also to increase the output power of the laser light source while at least partly avoiding the problems described above.

According to the disclosure, an optical system, in particular for microlithography, comprises a laser light source for generating a multiplicity of light pulses, and a control unit configured to control the laser light source in such a way that, for a light pulse sequence generated by the laser light source, the time period existing between respectively successive light pulses varies across the light pulse sequence.

A concept underlying the disclosure, in particular, in an optical system comprising a laser light source for generating a multiplicity of light pulses, is for the time period existing between two successive light pulses within a pulse succession not to be chosen to be constant in a conventional way, but rather to be varied. In this respect, the disclosure includes, in particular, a deliberate detuning of the laser light source (in the sense of a departure from an operating state with a one-off "optimized" temporal interval between successive light pulses) with the aim firstly of achieving a reduction of the speckle contrast (and thus an improvement in the overlay performance of the optical system, this being crucially determined by the speckle contrast) and secondly of also making it possible to increase the repetition rate of the laser light source (and thus to increase the throughput during operation of the optical system) while avoiding an excitation of undesired (chamber) resonances in the laser light source. In particular, the variation according to the disclosure of the time period existing between two successive light pulses within a pulse succession or light pulse sequence has the effect that the light field is different for each of the relevant light pulses, with the consequence that the temporal to and spatial coherence that is crucial for the speckle contrast is destroyed.

In accordance with one embodiment, the control unit is configured to control at least one actuator for manipulating the position of at least one optical component of the laser light source.

In accordance with one embodiment, the optical system comprises an optical pulse stretcher having a plurality of mirrors. In this case, the optical component controlled at the actuator can be, in particular, a mirror of the optical pulse stretcher.

In accordance with one embodiment, the control unit is configured to variably adjust a temporal delay of a trigger signal generated for triggering an energy feed into a laser medium of the laser light source. This embodiment can allow for undesirable features arising of acoustic resonances as described in the introduction to be efficiently prevented before the light generated by the laser light source reaches further components such as an optical pulse stretcher, for instance. The laser medium can be the laser medium of a master oscillator of the laser light source and/or the laser medium of one or more power amplifying stages ("power amplifier") of the laser light source.

In accordance with one embodiment, the optical system furthermore comprises a first measuring unit for measuring a variable that is characteristic of a speckle contrast of the light generated by the laser light source. In this case, the control unit can be configured in particular to vary the temporal pulse succession of the light pulses depending on output signals of the first measuring unit.

In accordance with one embodiment, the optical system furthermore comprises a second measuring unit for measuring a variable that is characteristic of the bandwidth of the light generated by the laser light source. The control unit can in particular be configured here to vary the temporal pulse succession of the light pulses depending on output signals of the second measuring unit.

In accordance with one embodiment, the control unit comprises a random number generator for the random variation of the time period existing between each two successive light pulses.

In accordance with one embodiment, the control unit is configured to continuously increase or to continuously reduce the time period existing between each two successive light pulses between a predefined lower limit value and a predefined upper limit value.

In accordance with one embodiment, the laser light source is designed for generating the light pulses with a repetition rate of at least 7 kHz.

In accordance with one embodiment, the optical system is designed for an operating wavelength of less than 250 nm, in particular for an operating wavelength of less than 200 nm.

The disclosure furthermore also relates to a method for operating an optical system, in particular for microlithography, wherein the optical system comprises a laser light source for generating a multiplicity of light pulses, and wherein the laser light source is controlled in such a way that for a light pulse sequence generated by the laser light source, the time period existing between respectively successive light pulses varies across the light pulse sequence.

In accordance with one embodiment, this variation is adjusted on the basis of a measurement of a variable that is characteristic of a speckle contrast of the light generated by the laser light source.

In accordance with one embodiment, the variation is adjusted on the basis of a measurement of the respective bandwidth for at least one light pulse generated by the laser light source.

In accordance with one embodiment, the variation is adjusted in such a way that the average bandwidth of the light pulses generated by the laser light source is reduced in comparison with the average bandwidth that results without this variation.

In accordance with one embodiment, the variation is adjusted in such a way that the average bandwidth difference between successive light pulses is reduced in comparison with the average bandwidth difference that results without this variation.

In accordance with one embodiment, the variation is at least partly effected by manipulating the position of at least one optical component of the laser light source, in particular the position of at least one mirror of an optical pulse stretcher.

In accordance with one embodiment, the variation is at least partly effected by variably adjusting a temporal delay of a trigger signal generated for triggering an energy feed into a laser medium of the laser light source.

Further embodiments of the disclosure are evident from the description and the dependent claims.

The disclosure will be explained in greater detail below on the basis of an exemplary embodiment that is illustrated in the accompanying figures.

DETAILED DESCRIPTION

Embodiments of the present disclosure are explained below with reference to the diagrams in FIGS. 1-3 and also the schematic illustrations in FIGS. 4-5.

What these embodiments have in common is that in an optical system comprising a laser light source for generating a multiplicity of light pulses, the time period existing between two successive light pulses within a pulse succession or a light pulse sequence is not to be chosen to be constant in a conventional way, but rather is varied, with the aim firstly of achieving a reduction of the speckle contrast (and thus an improvement in the overlay performance of the optical system) and secondly of making it possible to increase the repetition rate of the laser light source (and thus to increase the throughput during operation of the optical system) while at the same time avoiding an excitation of undesired (chamber) resonances.

Figure 1:
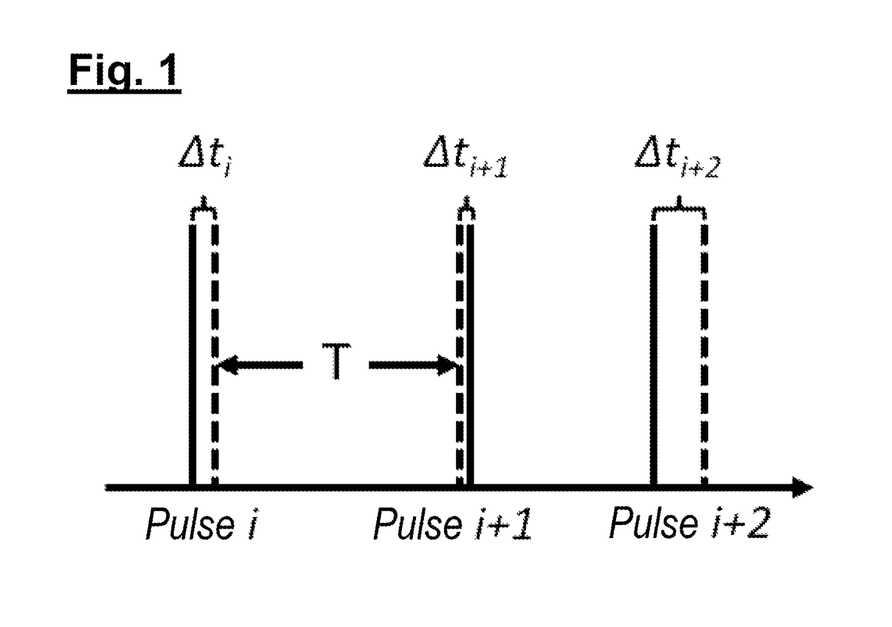
FIG. 1 shows a diagram for elucidating a variation according to the disclosure of the time period existing between successive light pulses in an optical system in accordance with a first embodiment.

Referring firstly to FIG. 1, in a first embodiment, the time period between two successive light pulses emitted by the laser light source can be varied randomly across a light pulse sequence. In this case, a lower limit value and an upper limit value can be predefined, in particular, within which this random variation can be carried out. The vertical dashed lines represent equidistant lines for illustration.

Figure 2:
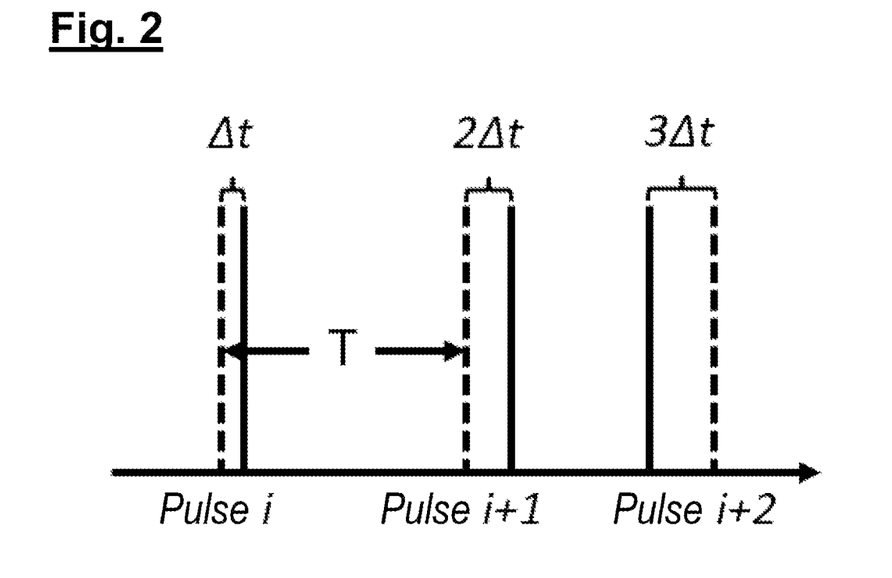
FIG. 2 shows a diagram for elucidating a variation according to the disclosure of the time period existing between successive light pulses in an optical system in accordance with a second embodiment.

In a second embodiment in accordance with FIG. 2, the time period between two successive light pulses emitted by the laser light source can also be continuously increased or continuously reduced over a light pulse sequence, in which case once again a lower limit value and an upper limit value can be predefined.

Figure 3:
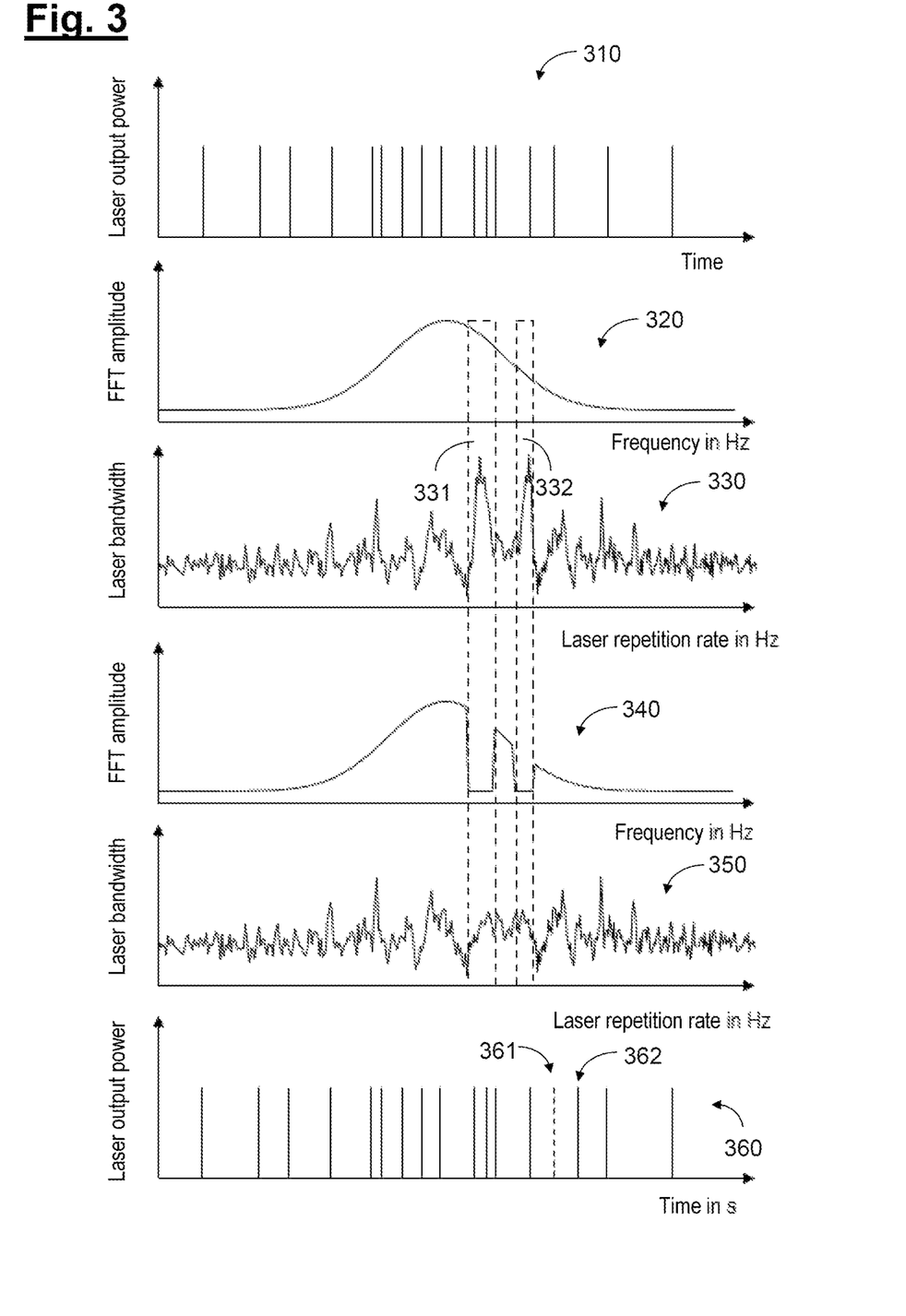
FIG. 3 shows diagrams for elucidating a variation according to the disclosure of the time period existing between successive light pulses in an optical system in accordance with a third embodiment.

In a third embodiment in accordance with FIG. 3, a pulse succession suitable for avoiding undesired chamber resonances can also be determined in a targeted manner and then be predefined for the further operation of the laser light source.

In accordance with FIG. 3, a currently generated pulse succession 310 (as temporal profile of the laser output power) is firstly determined here for a concrete configuration of the laser light source. An amplitude spectrum 320 is then determined for this pulse succession 310 in accordance with a fast Fourier transform (FFT). Furthermore, the resulting laser bandwidth of the laser light source as a function of the laser repetition rate is determined, an exemplary profile likewise being illustrated and designated by "330" in FIG. 3. In this profile 330 of the laser bandwidth, occurring resonances and the associated frequency bands (designated by way of example by "331", "332" in FIG. 3) are then identified. On the basis thereof, an "optimized" amplitude spectrum 320 suitable for eliminating these resonances 331, 332 is determined in accordance with a fast Fourier transform (FFT), the amplitude spectrum being designated by "340". The resulting laser bandwidth of the laser light source as a function of the laser repetition rate is designated by "350". From this a pulse succession 360 modified in a targeted manner (corresponding to the temporal profile of the laser output power) is then determined, wherein in the present scenario in accordance with FIG. 3 and merely by way of example the temporal position of a light pulse is shifted from "361" to "362".

Figure 4:
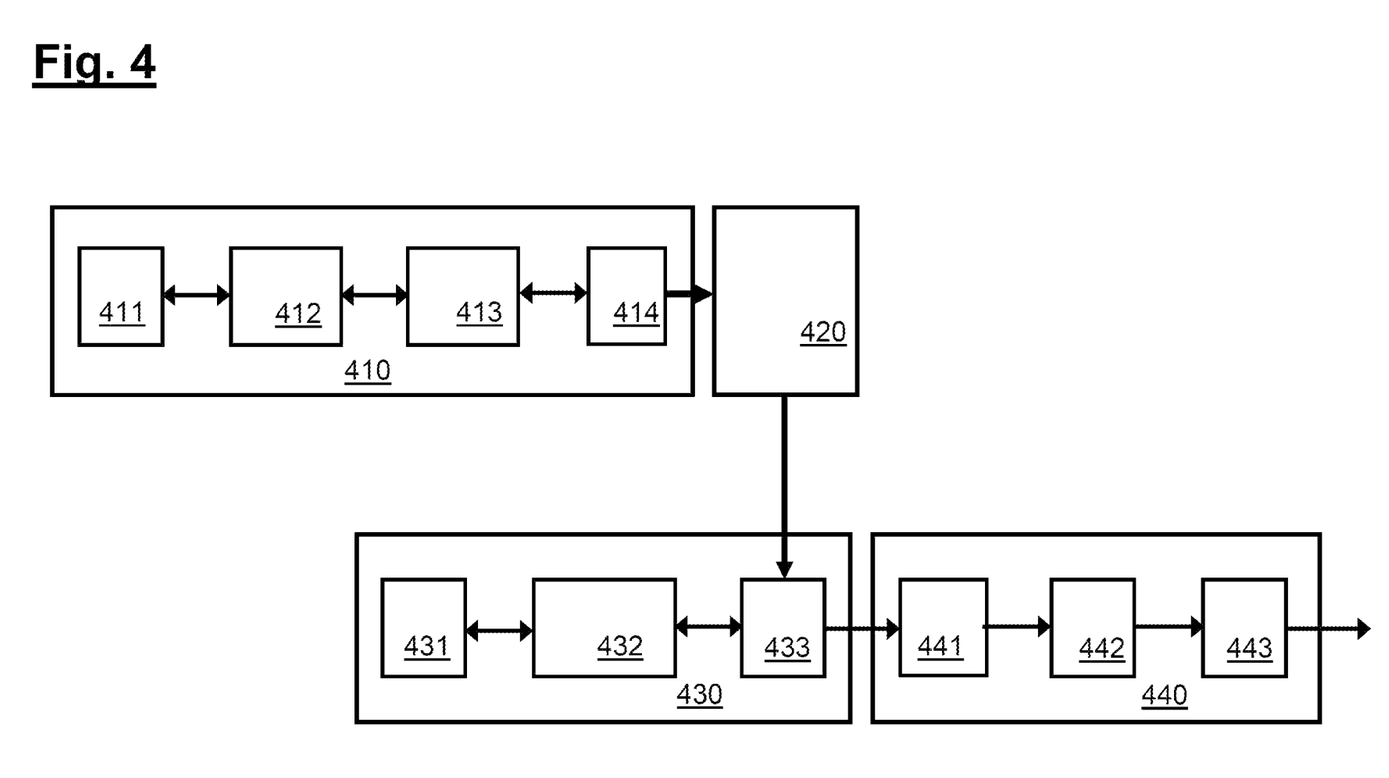
FIG. 4 shows a schematic illustration for elucidating the possible set-up of an optical system according to the disclosure.

FIG. 4 shows, in a merely schematic illustration, the set-up possible in principle of a gas discharge laser system in the form of an excimer laser in which the present disclosure can be realized.

The gas discharge laser system in accordance with FIG. 4 comprises, in particular, a seed laser 410, a relay optical unit 420, an amplifying stage 430 and a laser output subsystem 440.

The seed laser 410 comprises, in particular, a linewidth narrowing module 411, a master oscillator chamber (MO=master oscillator chamber) 412, a master oscillator output coupling unit (MO OC="master oscillator output coupler") 413 and a line centre analysis module 414.

The relay optical unit 420 has the effect, inter alia, of adapting or aligning the output signal of the seed laser 410 with respect to the amplifying stage 430 and can comprise, in particular, a beam expanding unit with a suitable prism arrangement and also a suitable optical retardation path.

The amplifying stage 430 comprises, in particular, a chamber 432 having the laser medium, a beam reversing module 431 and a unit 433 for coupling out part of the laser beam.

The laser output subsystem 440 comprises, in particular, a bandwidth analysis module 441, an optical pulse stretcher 442 and a further module 443. The optical pulse stretcher 442 serves to stretch the pulse length of the light pulses generated by the laser light source to a longer time duration of the order of magnitude of (100-450) ns, for example, by deflecting the electromagnetic radiation by way of circulation paths, in order to avoid degradation of downstream optical components. The further module 443 serves firstly for qualifying the output laser radiation (e.g. with regard to degree of polarization, near-field or far-field properties, Poynting vector, etc.). According to the disclosure, the functionality of this module 443 is now extended in such a way that the module 443 is furthermore also designed for measuring the speckle contrast. Moreover, according to the disclosure, the module 443 can also be designed for measuring the temporal duration of the light pulses.

On the basis of the (sensor) signals supplied by the module 443, according to the disclosure, the optical pulse stretcher 442 can now be detuned so as to achieve the sought reduction of the speckle contrast.

Figure 5:
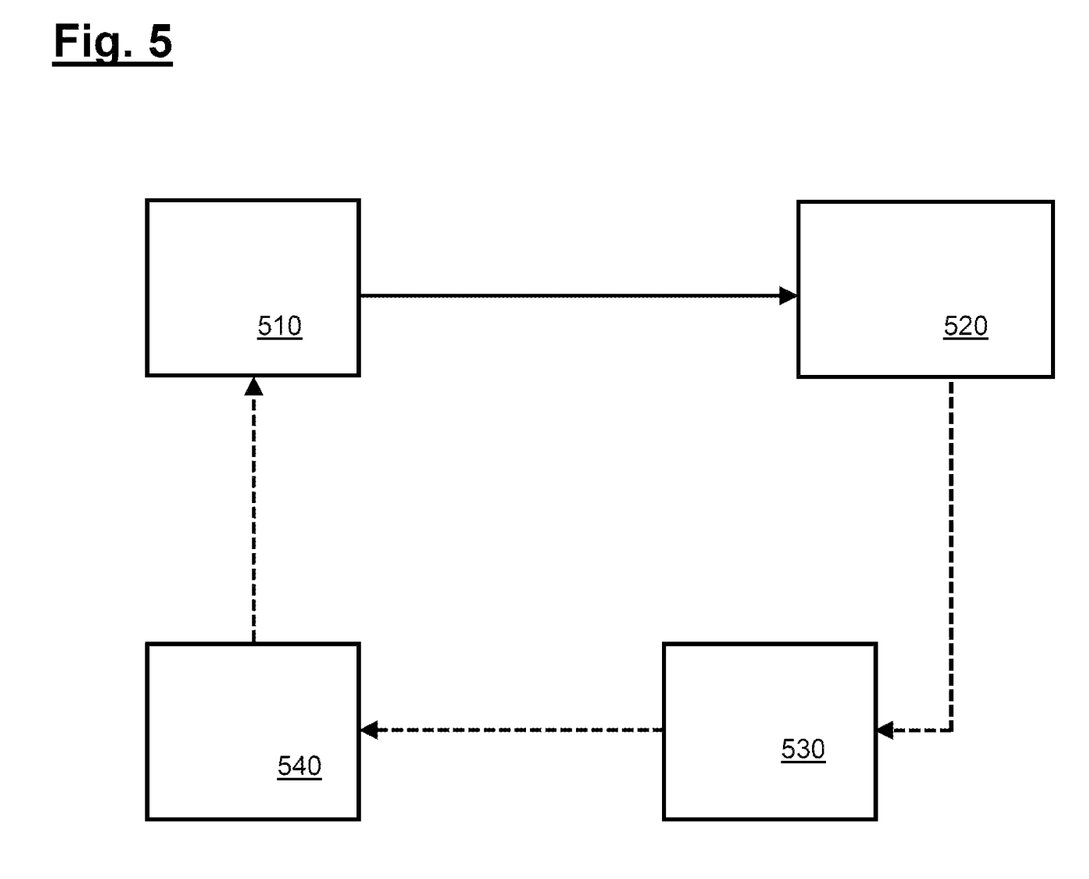
FIG. 5 shows a block diagram for elucidating further the possible functioning of an optical system according to the disclosure.

FIG. 5 shows, merely schematically, a block diagram for elucidating a corresponding closed-loop control concept. In this case, in FIG. 5, the optical pulse stretcher is designated by "510" and the further module by "520". On the basis of the sensor signals supplied by the module 520, a closed-loop control unit 530 controls an actuator 540 and thereby brings about the aforementioned detuning of the optical pulse stretcher 510 that is suitable for reducing the speckle contrast. For example, one or more mirrors in the optical pulse stretcher 510 can be mechanically adjusted by way of the actuator 530.

The disclosure is not restricted to the above-described control or detuning of the optical pulse stretcher in order to realize the desired speckle contrast reduction. In further embodiments, on the basis of the (sensor) signals supplied by the bandwidth analysis module 441 or by the line centre analysis module 414, the generation of the trigger signal for triggering the gas discharge can also be controlled temporally, such that e.g. the trigger signal can be generated earlier or later by a few nanoseconds (ns) or microseconds (μs).

Figure 6:
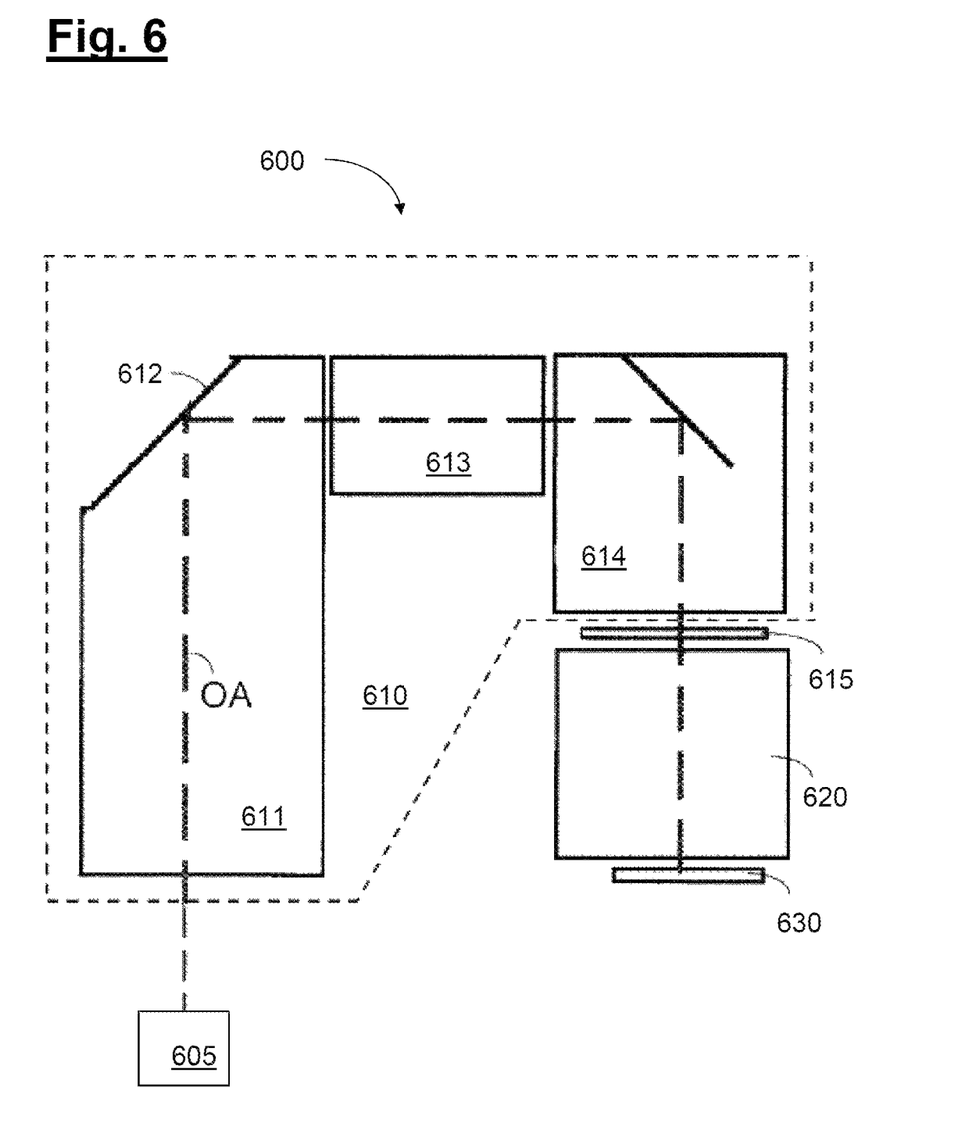
FIG. 6 shows a schematic illustration for elucidating the possible set-up of a microlithographic projection exposure apparatus designed for operation in the DUV.

FIG. 6 shows a set-up possible in principle of a microlithographic projection exposure apparatus 600 designed for operation in the DUV.

The projection exposure apparatus 600 in accordance with FIG. 6 comprises an illumination device 610 and a projection lens 620. The illumination device 610 serves for illuminating a structure-bearing mask (reticle) 615 with light from a light source unit 605 comprising a laser light source for example in the form of an ArF excimer laser for an operating wavelength of 193 nm (or else in the form of a KrF excimer laser for an operating wavelength of 248 nm) and also a beam shaping optical unit that generates a parallel light beam. In this case, the laser light source can be designed in the manner according to the disclosure.

The illumination device 610 comprises an optical unit 611 which, inter alia, comprises a deflection mirror 612 in the example illustrated. The optical unit 611 can comprise for example a diffractive optical element (DOE) and a zoom-axicon system for producing different illumination settings (i.e. intensity distributions in a pupil plane of the illumination device 610). Downstream of the optical unit 611 in the light propagation direction there are situated in the beam path a light mixing device (not illustrated), which in a manner known per se, for example, can comprise an arrangement of micro-optical elements suitable for achieving light mixing, and also a lens element group 613, downstream of which is situated a field plane with a reticle masking system, which is imaged by a lens 614 disposed downstream in the light propagation direction onto the structure-bearing mask (reticle) 615 arranged in a further field plane and thereby delimits the illuminated region on the reticle. The structure-bearing mask 615 is imaged by the projection lens 620 onto a substrate, or a wafer 630, provided with a light-sensitive layer (photoresist). In particular, the projection lens 620 can be designed for immersion operation, in which case an immersion medium is situated upstream of the wafer, or the light-sensitive layer thereof, in relation to the light propagation direction. Furthermore, it can have for example a numerical aperture NA greater than 0.85, in particular greater than 1.1.

Even though the disclosure has also been described on the basis of specific embodiments, numerous variations and alternative embodiments will be apparent to a person skilled in the art, e.g. through combination and/or exchange of features of individual embodiments. Accordingly, it goes out saying for a person skilled in the art that such variations and alternative embodiments are concomitantly encompassed by the present disclosure, and the scope of the disclosure is restricted only within the meaning of the appended patent claims and the equivalents thereof.

What is claimed is:

1. An optical system, comprising:
   a laser light source configured to generate a multiplicity of light pulses;
   a first measuring unit configured to measure a variable that is characteristic of a speckle contrast of the light generated by the laser light source;
   a second measuring unit configured to measure a variable that is characteristic of a bandwidth of the light generated by the laser light source; and
   a control unit configured to control the laser light source so that, for a light pulse sequence generated by the laser light source, a time period between respectively successive light pulses varies across the light pulse sequence depending on output signals of the first measuring unit and the second measuring unit.

2. The optical system of claim 1, further comprising an actuator, wherein the laser light source comprises an optical component, and the control unit is configured to manipulate a position of the actuator to manipulate a position of the optical component.

3. The optical system of claim 1, further comprising an optical pulse stretcher comprising a plurality of mirrors.

4. The optical system of claim 3, wherein at least one the mirrors is an optical component of the laser light source.

5. The optical system of claim 4, further comprising an actuator, wherein the control unit is configured to manipulate a position of the actuator to manipulate a position of the optical component.

6. The optical system of claim 1, wherein the laser light source comprises a laser medium, and the control unit is configured to variably adjust a temporal delay of a trigger signal generated to trigger an energy feed into the laser medium.

7. The optical system of claim 1, wherein the control unit comprises a random number generator configured to randomly vary the time period between each two successive light pulses.

8. The optical system of claim 1, wherein the control unit is configured to continuously change the time period between each two successive light pulses.

9. The optical system of claim 8, wherein the time period is continuously changed between a predefined upper value and a predefined lower value.

10. The optical system of claim 1, wherein the laser light source is configured to generate the light pulses with a repetition rate of at least 7 kHz.

11. The optical system of claim 1, wherein the optical system is configured to operate at an operating wavelength of less than 250 nm.

12. An apparatus, comprising:
    an optical system according to claim 1;
    an illumination device; and
    a projection lens,
    wherein the apparatus is a microlithographic projection exposure apparatus.

13. The optical system of claim 1, wherein the first measuring unit is configured to measure the speckle contrast of the light generated by the laser light source.

14. A method of operating an optical system comprising a laser light source configured to generate a multiplicity of light pulses and a controller configured so that, for a light pulse sequence generated by the laser light source, a time period between respectively successive light pulses varies across the light pulse sequence, the method comprising:
    varying the time period based on: measurement of a variable that is characteristic of a speckle contrast of the light generated by the laser light source; and a measurement of a respective bandwidth for at least one light pulse generated by the laser light source.

15. The method of claim 14, wherein the variation is adjusted to reduce an average bandwidth of the light pulses generated by the laser light source.

16. The method of claim 14, wherein the variation is adjusted to reduce an average bandwidth difference between successive light pulses.

17. The method of claim 14, further comprising manipulating the position of an optical component of the laser light source to at least partly effect the variation.

18. The method of claim 14, further comprising adjusting a temporal delay of a trigger signal generated for triggering an energy feed into a laser medium of the laser light source to at least partly effect the variation.

19. The method of claim 14, comprising varying the time period based on a measurement of the speckle contrast of the light generated by the laser light source.

* * * * *

UNITED STATES PATENT AND TRADEMARK OFFICE
CERTIFICATE OF CORRECTION

PATENT NO. : 12,416,865 B2
APPLICATION NO. : 18/186396
DATED : September 16, 2025
INVENTOR(S) : Conrad Wolke and Barbara Moser Page 1 of 1

It is certified that error appears in the above-identified patent and that said Letters Patent is hereby corrected as shown below:

In the Specification

Column 2, Line 13, delete "technologiesfon" and insert -- technologies for --.

Column 3, Line 2, after "temporal" delete "to".

In the Claims

Column 7, Line 53, in Claim 4, after "one" insert -- of --.

Column 8, Line 36, in Claim 14, after "on:" insert -- a --.

Signed and Sealed this
Fourth Day of November, 2025

John A. Squires
*Director of the United States Patent and Trademark Office*